United States Patent [19]

Zertani et al.

[11] Patent Number: 5,066,564
[45] Date of Patent: Nov. 19, 1991

[54] PHOTOPOLYMERIZABLE MIXTURE AND RECORDING MATERIAL PRODUCED THEREFROM

[75] Inventors: Rudolf Zertani, Mainz-Bretzenheim; Dieter Mohr, Budenheim; Klaus Rode, Suzano-SP, all of Fed. Rep. of Germany

[73] Assignee: Hoechst Aktiengesellschaft, Frankfurt am Main, Fed. Rep. of Germany

[21] Appl. No.: 381,828

[22] Filed: Jul. 19, 1989

[30] Foreign Application Priority Data

Jul. 22, 1988 [DE] Fed. Rep. of Germany ....... 3824903

[51] Int. Cl.$^5$ .............................................. G03F 7/029
[52] U.S. Cl. .................................... 430/284; 430/285; 430/288; 430/906; 430/915; 430/925; 522/25; 522/26
[58] Field of Search ............... 430/270, 915, 913, 285, 430/288, 284, 925; 522/25, 26

[56] References Cited

U.S. PATENT DOCUMENTS

| | | | |
|---|---|---|---|
| 3,488,269 | 1/1970 | Allen et al. | 204/159.23 |
| 3,597,343 | 8/1971 | Delzenne et al. | 204/159.23 |
| 3,759,807 | 9/1973 | Osborn et al. | 204/159.23 |
| 4,054,682 | 10/1977 | Kuesters et al. | 427/54 |
| 4,071,424 | 1/1978 | Dart et al. | 204/159.15 |
| 4,174,307 | 11/1979 | Rowe | 204/159.19 |
| 4,983,498 | 1/1991 | Rode et al. | 430/284 |

FOREIGN PATENT DOCUMENTS

| | | |
|---|---|---|
| 222320 | 5/1987 | European Pat. Off. . |
| 3106366 | 9/1982 | Fed. Rep. of Germany . |
| 3710281 | 3/1988 | Fed. Rep. of Germany . |

OTHER PUBLICATIONS

Patent Abstract, 74–Radiation Chem., Photochem., vol. 85, 1976, 85:54620A, Japan, Kokai 75,129,214.
Chemical Abstracts, vol. 92, 1980, 92:155901t, Jpn. Kokai Tokkyo Koho 79,151,024.

*Primary Examiner*—Charles L. Bowers, Jr.
*Assistant Examiner*—John S. Y. Chu
*Attorney, Agent, or Firm*—Foley & Lardner

[57] ABSTRACT

A photopolymerizable mixture is disclosed that comprises,
a) a polymeric binder,
b) an acrylate or alkacrylate of a polyhydric alcohol containing one or more urea groups and one or more urethane groups,
c) a photoreducible dye as photoinitiator,
d) a trihalomethyl compound which can be cleaved by irradiation, and
e) an acridine or phenazine compound which is active as a photoinitiator.

The mixture is suitable for the production of printing plates and photoresists and is distinguished by an increased shelf life.

18 Claims, No Drawings

PHOTOPOLYMERIZABLE MIXTURE AND RECORDING MATERIAL PRODUCED THEREFROM

BACKGROUND OF THE INVENTION

The present invention relates to a photopolymerizable mixture comprising a polymeric binder, a polymerizable compound having at least two acrylate or alkacrylate groups in the molecule, and a photoinitiator combination.

Photopolymerizable mixtures containing acrylates and/or methacrylates as photopolymerizable compounds are known. For the production of photoresist materials, in particular dry photoresist layers, mixtures are preferred containing acrylates or methacrylates having urethane groups in the molecule that can be developed using aqueous alkaline solutions. Such mixtures are described, for example, in U.S. Pat. Nos 3,782,961; 3,850,770; 3,960,572; 4,019,972 and 4,250,248.

Photopolymerizable mixtures are also known which, in order to increase the photosensitivity, contain certain combinations of photoinitiators and activators, for example combinations of carbonyl-group-containing initiators and tertiary amines. Such mixtures with a synergistic action are described, for example, in U.S. Pat. Nos. 4,054,682; 4,071,424 and 3,759,807. A disadvantage of these mixtures containing low-molecular-weight amines is that they have a short shelf life since the amines can easily bleed out, in particular from thin coatings.

In JP-A No. 50/129,214, filed on 2 Apr. 1974 with number 49/36,614, a photopolymerizable mixture is described containing a tetra(meth)acrylate of a N,N,N',N'-tetrahydroxyalkyl-alkylenediamine as the polymerizable compound. The tetrafunctional compound serves as a crosslinking agent.

It is also known that the free-radical polymerization of ethylenically unsaturated compounds can be initiated by irradiation with visible light in the presence of photoreducible dyes and reducing agents, for example amines (U.S. Pat. No. 3,097,096). However, these initiator combination are essentially employed only in aqueous solution or in combination with water-soluble binders.

Initiator combinations of photoreducible dyes and other reducing agents are described in U.S. Pat. Nos. 3,597,343 and 3,488,269. Photopolymerizable mixtures containing exclusively photoreducible dyes as initiators have hitherto not been employed in practice due to their unsatisfactory photosensitivity.

In JP-A No. 54/151,024, a photopolymerizable mixture is described containing an initiator combination of a merocyanine dye and a trihalomethyl-substituted s-triazine that is sensitive towards visible light, for example an argon laser. However, the sensitivity of these mixtures towards visible laser light is inadequate for practical use.

German Patent Application No. P 37 10 281.8 describes photopolymerizable mixtures containing (meth)acrylates having urethane groups, tertiary amino groups and optionally urea groups in their molecules; polymeric binders; and, as photoinitiators, a combination of a photoreducible dye, a radiation-sensitive trihalomethyl compound and an acridine, phenazine or quinoxaline compound.

SUMMARY OF THE INVENTION

It is therefore an object of the invention to provide photopolymerizable mixtures having a good shelf life that are suitable for the production of printing plates for long runs and of photoresists having high resistance, in the hardened state, to processing solutions, these products being distinguished by high photosensitivity in the near ultra-violet and visible spectral regions and therefore being suitable, in particular, for laser beam recording in the visible region.

According to the present invention, a photopolymerizable mixture is provided that comprises, in admixture, a) a polymeric binder in an amount sufficient to form a uniform film,
b) an acrylate or alkacrylate of a polyhydric alcohol,
c) a photoreducible dye,
d) a trihalomethyl compound which can be cleaved by irradiation, and
e) an acridine, phenazine or quinoxaline compound which acts as photoinitiator, wherein the acrylate or alkacrylate corresponds to the general formula I $$Q\mathopen{[}(X^1-CH_2O)_a\text{CONH}(X^2-\text{NHCOO})_b X^3-\text{OOC}-\underset{R}{C}=CH_2]_n \quad (I)$$

in which
Q denotes $$-\underset{|}{N}- \quad -N\diagdown\overset{D^1}{\underset{D^2}{\diagup}}N- \quad \text{or} \quad D^3\diagdown\overset{}{\underset{Z}{\diagup}}N-$$

R denotes a hydrogen atom, a methyl group or an ethyl group,
$X^1$ denotes $C_mH_{2m}$ or $$C_mH_{2m-1}O-\text{CONH}(-X^2-\text{NHCOO})_b-X^3-\text{OOC}-\underset{R}{\overset{R}{C}}-CH_2,$$

$X^2$ denotes a saturated hydrocarbon group having 2 to 12 carbon atoms,
$X^3$ denotes a saturated hydrocarbon group which may be interrupted by 1 to 5 ether oxygen atoms,
$D^1$ and $D^2$ each denote a saturated hydrocarbon group having 1 to 5 carbon atoms,
$D^3$ denotes a saturated hydrocarbon group having 4 to 8 carbon atoms, which together with the nitrogen atom forms a 5- or 6-membered ring,
Z denotes a hydrogen atom or a group of the formula $$C_kH_{2k}-O-\text{CONH}(-X^2-\text{NHCOO})_b-X^3-\text{OOC}=CH_2,$$

a denotes zero or an integer from 1 to 4,
b denotes zero or 1
m and k denote integers from 1 to 12, and
n denotes 1, 2 or 3, depending on the valency of Q, it being possible for all radicals of the same definition to be identical to or different from one another, and 'a' being zero in at least one substituent of the group Q.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Photopolymerizable mixtures according to the present invention comprise an acrylate or alkacrylate of a polyhydric alcohol according to general formula I above. Where, in the compound of the general formula I, more than one radical of the type mentioned in square parentheses is bound to the central group Q, these radicals may be different from one another.

Preference is given to compounds of the formula I which have at least two polymerizable acrylate or alkacrylate groups.

Compounds of the formula I which in addition to a urea group contain at least one urethane group are preferably used. The term "urea groups" defines groups of the formula

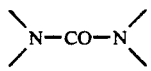

where the free valencies on the nitrogen are saturated with optionally substituted hydrocarbon radicals. It is, however, also possible for one valency on a nitrogen atom to be bonded to another carbonylamide group (CONH), so that a biuret structure is obtained. Compounds of this type are also suitable in accordance with the invention. In a preferred embodiment of the present invention:

R is a hydrogen atom or a methyl group, in particular a methyl group, $X^2$ is a straight-chain or branched aliphatic or cycloaliphatic radical preferably having 4 to 10 carbon atoms, and $X^3$ has 2 to 15 carbon atoms. If these are pure carbon chains, those having 2 to 12, preferably 2 to 6, carbon atoms are generally employed. $X^3$ can also be a cycloaliphatic group having 5 to 10 carbon atoms, in particular a cyclohexylene group.

$D^1$ and $D^2$ may be identical or different and, together with the two nitrogen atoms, form a saturated heterocyclic ring having 5 to 10, preferably 6, ring members.

The symbol "a" preferably denotes zero or 1; m preferably is an integer from 2 to 10.

The polymerizable compounds of the formula I where Q=N, which contain two urethane groups in each radical (b=1) are prepared by reacting acrylates or alkylacrylates which contain free hydroxyl groups in a known fashion with the same number of moles of diisocyanates, and reacting the excess isocyanate group with hydroxyalkylamines. When a is zero, a urea group is produced.

Examples of the hydroxyalkylamines used as starting materials are diethanolamine, N-hydroxypropylpiperazine, 3-piperazinylpropane-1,2-diol, N-(2-hydroxyethyl)piperazine, 2-hydroxyethylpiperidine, 2-hydroxymethyl-piperidine, 3-hydroxymethyl-piperidine, N-hydroxyethyl-ethylenediamine, 4-hydroxypiperidine and 3-amino-1,2-propanediol.

Examples of the diisocyanates used as starting materials are ethylene diisocyanate, propylene diisocyanate, butylene-1,3-diisocyanate, hexamethylene diisocyanate, 2,2,4-trimethylhexamethylene diisocyanate, 2,4-dimethyl-6-ethyloctamethylene diisocyanate, 1,4-cyclohexylene diisocyanate, 1,3-cyclopentylene diisocyanate, 1,4-diisocyanatomethylcyclohexane and 1,1,3-trimethyl-3-isocyanatomethyl-5-isocyanatocyclohexane.

The hydroxyl-group-containing esters used are, in particular, hydroxyethyl methacrylate and hydroxypropyl methacrylate (n or iso), and the corresponding acrylates. However, the following compounds can also be used with advantage: 2-hydroxybutyl methacrylate, 4-hydroxybutyl methacrylate, 2-hydroxycyclohexyl methacrylate and other hydroxyalkyl methacrylates having up to 12, preferably up to 6, carbon atoms in the alkyl radical, diethylene glycol monomethacrylate, triethylene glycol monomethacrylate and other polyethylene glycol monomethacrylates having up to 5 oxyethylene units, and the corresponding acrylates.

The polymerizable compounds of the formula I where b is 0 are prepared by reacting the above-described hydroxyalkylamines with isocyanate-group-containing acrylates or alkylacrylates.

The isocyanate-group-containing ester employed is, in particular, isocyanatoethyl (meth)acrylate. However, the following compounds can also be used with advantage: 3-isocyanatopropyl methacrylate, 4-isocyanatobutyl methacrylate, isocyanatoisohexyl methacrylate and other isocyanatoalkyl (meth)acrylates having up to 12, preferably up to 6, carbon atoms in the alkyl radical.

The polymerizable compounds of the formula I where

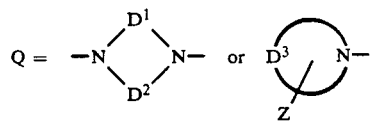

are prepared analogously to the above-described polymerizable compounds.

The reaction of the isocyanates with the hydroxyl-group-containing amines and alkylacrylates is expediently carried out in an inert solvent such as toluene, pyridine or methyl ethyl ketone. In order to thermally stabilize the products, which have a great tendency towards polymerization, quinones or phenols, preferably 2,6-ditert.butyl-p-cresol are added in concentrations of about 0.01 to 2% by weight.

Besides other components, the above-described polymerizable compounds, which apart from urethane groups contain at least one urea grouping in the molecule, are responsible for the high photosensitivity of the photopolymerizable mixtures. Monomers which exclusively contain urethane groups in their molecules or do not correspond to formula I have a considerably reduced shelf life. This different behavior is possibly due to the formation of hydrogen bridges between the urea groups and the polymeric binder, which may result in a reduced sensitivity to oxygen.

In addition to the photooxidizable polymerizable compounds described, conventional polymerizable compounds which contain two or more polymerizable acrylate or methacrylate groups can also be added. Examples are acrylates and methacrylates of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols. The products of the reaction of diisocyanates with unsaturated partial esters of polyhdric alcohols are also used with advantage. Such monomers are described in DE-A No. 2,064,079, DE-A No. 2,361,041 and DE-A No. 2,822,190.

The proportion of monomers in the mixture is generally about 10 to 80, preferably about 20 to 60, by weight.

The mixture according to the invention contains a photoreducible dye as photoinitiator component. Suitable dyes are, in particular, xanthene, benzoxanthene, benzothioxanthene, thiazine, pyronine, porphyrine or acridine dyes.

Preferred representatives of xanthene dyes are compounds of the general formula II

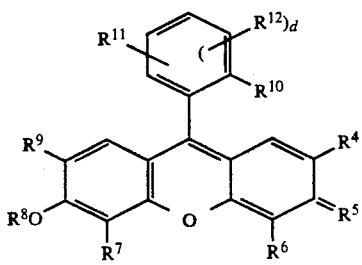

in which
- $R^4$ and $R^9$ are identical or different and denote hydrogen or halogen atoms, nitro or hydroxyl groups or groups of the formula —HgOH,
- $R^6$ and $R^7$ are identical or different and denote hydrogen or halogen atoms or hydroxyl groups,
- $R^5$ denotes oxygen or $^{(+)}$NHalkyl $X^{(-)}$
- $R^8$ denotes a hydrogen atom, an alkali metal cation, ammonium cation or trialkylammonium cation, or an alkyl or acyl group,
- $R^{10}$ denotes a hydrogen atom or a $COOR^{13}$ group,
- $R^{11}$ denotes a hydrogen or halogen atom or an amino group,
- $R^{12}$ denotes a hydrogen or halogen atom,
- $R^{13}$ denotes a hydrogen atom, an alkali metal cation or ammonium cation, an alkyl group or a polymeric radical,
- X denotes an anion, and
- d denotes zero or an integer from 1 to 3.

If the radicals $R^5$, $R^8$ and $R^{13}$ are alkyl radicals, or contain alkyl radicals, the latter generally have 1 to 25, in particular 1 to 18, carbon atoms.

In practice, the photopolymerizable recording material according to the invention frequently contains an oxygen-inhibiting protective layer. If a xanthene dye is present in this layer, this leads to shadowing of the photosensitive layer below and thus to a decrease in sensitivity. Therefore, dyes of the formula II whose alkyl radicals $R^5$, $R^8$ and, particularly, $R^{13}$ are relatively long-chain and thus prevent migration into the protective coating are used with advantage in the photopolymerizable layer. Dyes of the formula II whose $R^{13}$ radical is an alkyl radical having more than 8 carbon atoms are used with particular advantage.

Suitable thiazine dyes are compounds of the formula III, and suitable pyronine dyes are compounds of the formula IV

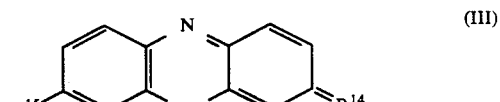

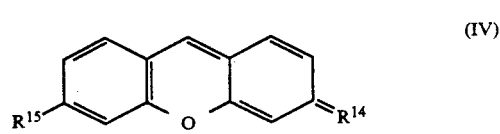

in which
- $R^{14}$ is one of the groups $=NH_2^{(+)} X^{(-)}$, $=NHalkyl^{(+)} X^{(+)}$ or $=N(alkyl)_2^{(+)} X^{(-)}$,
- $R^{15}$ is an amino, alkylamino or dialkylamino group and
- X is an anion.

In the formulae III and IV, alkyl groups have the same meanings as in the formula II.

Suitable benzoxanthene and benzothioxanthene dyes are described in DE-A No. 20 25 291 and in German Patent Application No. P 37 43 457.8.

A suitable porphyrine dye is, for example, hematoporphyrine, and a suitable acridine dye is, for example, acriflavinium chloride hydrochloride. Examples of compounds of the formula II are Eosine B (C.I. No. 45 400), Eosine J (C.I. No. 45 380), alcohol-soluble Eosine (C.I. 45 386), Cyanosine (C.I. No. 45 410), Rose Bengal, Erythrosine (C.I. No. 45 430), 2,3,7-trihydroxy-9-phenylxanthen-6-one and Rhodamine 6 G (C.I. No. 45 160).

Examples of compounds of the formula III are Thionine (C.I. No. 52 000), Azure A (C.I. No. 52 005) and Azure C (C.I. No. 52 002).

Examples of dyes of the formula IV are Pyronine B (C.I. No. 45 010) and Pyronine GY (C.I. 45 005).

The amount of component (c) in the mixture is generally between about 0.01 and 10, preferably between about 0.05 and 4, % by weight, relative to the nonvolatile components of the mixture.

In order to increase the photosensitivity, the mixtures according to the invention contain compounds having trihalomethyl groups (d) which can be cleaved photolytically. These compounds are known per se as free-radical-forming photoinitiators for photopolymerizable mixtures. As such coinitiators, compounds containing chlorine and bromine, in particular chlorine, as halogens have proven particularly successful. The trihalomethyl groups can be bound directly to an aromatic carbocyclic or heterocyclic ring or via a conjugated chain. Preferred compounds are those containing a triazine ring in the basic structure, which preferably carries 2 trihalomethyl groups, in particular those which are described in EP-A No. 137,452, DE-A No. 2,718,259 and DE-A No. 2,243,621. These compounds exhibit strong light absorption in the near UV region, at about 350–400 nm. Coinitiators are also suitable which absorb only little, or not at all in the spectral region of the copying light such as trihalomethyltriazines which contain substituents having relatively short mesomerism-capable electron systems or aliphatic substituents. Compounds having another basic structure, but which absorb in the shorter-wave UV region, such as phenyl trihalomethyl sulfones or phenyl trihalomethyl ketones, for example phenyl tribromomethyl sulfone, are also suitable.

The components (d) are generally employed in an amount from about 0.01 to 10, preferably from about 0.05 to 6, % by weight, relative to the nonvolatile components of the mixture.

The mixtures according to the invention contain an acridine, phenazine or quinoxaline compound (e) as a further initiator component. These compounds are known as photoinitiators and are described in DE-C No. 2,027,467 and DE-C No. 2,039,861. Due to these compounds, the sensitivity of the mixture is increased, above all in the near ultra-violet region. Suitable representatives of this class of compounds are described in the DE-C mentioned. Examples are 9-substituted acridines, such as 9-phenyl-, 9-p-methoxyphenyl- or 9-acetylaminoacridine, or acridine derivatives containing fused aromatic nuclei, for example benz(a)acridine. A suitable phenazine derivative is, for example, 9,10,-dimethylbenz(a)phenazine.

Suitable quinoxaline derivatives are, in particular, the 2,3-diphenyl derivatives which are preferably further substituted in the two phenyl radicals by methoxy groups. In general, the acridine derivatives are preferred as components (e).

The amount of component (e) in the mixture is likewise in the range of about 0.01 to 10 % by weight, preferably between about 0.05 and 5 % by weight.

If a further increase in the sensitivity of the mixture in the visible spectral region is desired, this can be achieved by adding a compound (f) of the dibenzalacetone or coumarine type. This addition causes higher resolution in the copy and continuous sensitization of the mixture for the visible spectral region up to wavelengths of about 600 nm. Suitable representatives of these compounds are 4,4' disubstituted dibenzalacetones, for example 4-diethylamino-4'-methoxydibenzalacetone, or coumarine derivatives such as 3-acetyl-7-diethylaminocoumarine, 3-benzimidazolyl-7-diethylamino-coumarineorcarbonyl-bis-(7-diethylaminocoumarine)

The amount of compound (f) is likewise in the range from about 0.01 to 10, preferably from about 0.05 to 4, % by weight, relative to the nonvolatile components in the mixture.

The total amount of polymerization initiators (c), (d) and (e), or where appropriate the total amount including component (f), is generally about 0.05 to 20, preferably about 0.1 to 10, % by weight. The molar ratio of components (c), (d), (e) and (f) to one another is preferably in the following ranges (c):(d):(e):(f)=1:(4 to 10):(1 to 5):(0 to 4).

Binders that may be used include a large number of soluble organic polymers. Examples include polyamides, polyvinyl esters, polyvinyl acetals, polyvinyl ethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers listed.

Binders that are insoluble in water but soluble, or at least swellable, in aqueous-alkaline solutions are used with particular advantage since layers containing such binders can be developed using the preferred aqueous-alkaline developers. Such binders can contain, for example, the following groups: —COOH, —PO$_3$H$_2$, SO$_3$H, —SO$_2$NH—, —SO$_2$—NH—SO$_2$— and —SO$_2$—NH—CO—.

Examples of these which may be mentioned include maleic resins, polymers made from β-(methacryloyloxy)-ethyl-N-(p-tolylsulfonyl)-carbamate, and copolymers of these and similar monomers with other monomers, and also vinyl acetate/crotonic acid copolymers and styrene/maleic anhydride copolymers. Alkyl methacrylate/methacrylic acid copolymers and copolymers made from methacrylic acid, higher alkyl methacrylates and methyl methacrylate and/or styrene, acrylonitrile and the like, as described in DE-A Nos. 2,064,080 and 2,363,806, are preferred.

The amount of binders is generally about 20 to 90, preferably about 30 to 80, % by weight, of the components of the coating.

Depending on the planned use and depending on the desired properties, the photopolymerizable mixtures can contain a wide variety of substances as additives, for example, inhibitors for preventing thermal polymerization of the monomers, hydrogen donors, dyes, colored and colorless pigments, color formers, indicators, plasticizers and chain transfer agents.

These components are expediently selected so that they absorb as little as possible in the actinic radiation region, which is important for the initiation process.

In the context of this description, actinic radiation should be understood as any radiation whose energy corresponds at least to that of visible light. Suitable above all are visible light and long-wave UV radiation, but also short-wave UV radiation, laser radiation, electron radiation and X-ray radiation.

The photopolymerizable mixture can be used for a very wide variety of applications, for example, for the production of paints which are hardened by light, as dental fillings or tooth replacement material and, in particular, as photosensitive recording material in the reproduction field.

The detailed description of the invention is limited to the last-mentioned field of application, but the invention is not limited thereto. Possible applications in this area include recording layers for the photomechanical production of printing forms for letterpress printing, planographic printing, rotogravure printing, screen printing, of relief copies, for example the production of braille texts, of individual copies, tanned images, pigmented images, etc. In addition, the mixtures can be used for the photomechanical production of etch resists, for example for the production of nameplates, of copied circuits and for chemical milling. The mixtures according to the invention have particular importance as layers for the production of planographic printing plates and for the photoresist technique.

The commercial utilization of the mixture for the applications mentioned can take place in the form of a liquid solution or dispersion, for example as a photoresist solution which is applied by the user himself to an individual support, for example, for chemical milling, for the production of copied circuits, of screen-printing stencils and the like. The mixture can also be present as a solid, photosensitive layer on a suitable support in the form of a storable, pre-coated, photosensitive copying material, for example, for the production of printing plates. The mixture is likewise suitable for the production of dry resist materials.

It is generally favorable to keep the mixture away from the influence of atmospheric oxygen during the photopolymerization. When the mixture is used in the form of thin copying layers, it is advisable to apply a suitable protective film that is impermeable to oxygen. This can be self supporting and peeled off before development of the copying layer. For this purpose, polyester films, for example, are suitable. The protective film can also comprise a material that dissolves in the developer liquid or can at least be removed during development from the non-hardened areas. Materials suitable for this purpose include, for example, waxes, polyvinyl alcohol, polyphosphates, sugars, etc. Such protective layers generally have a thickness of about 0.1 to 10 μm, preferably of about 1 to 5, μm.

Suitable layer supports for copying materials produced using the mixture according to the invention are, for example, aluminum, steel, zinc, copper and plastic films, for example made from polyethylene terephthalate or cellulose acetate, and also screen-printing bases, such as Perlon gauze. In many cases, it is favorable to subject the support surface to pre-treatment (chemical or mechanical), the aim of which is to set the adhesion of the layer correctly, to improve the lithographic properties of the support surface or to reduce the reflectivity of the support in the actinic range of the copying layer (anti-halation).

The production of the light-sensitive materials using the mixture according to the invention takes place in a known fashion. Thus, the mixture can be taken up in a solvent, and the solution or dispersion is then applied to the intended support by pouring, spraying, dipping, roller application, etc., and subsequently dried. Thick layers (e.g., of 250 μm and more) are advantageously produced by extrusion or press molding as self-supporting films which are then laminated, if desired, onto the support. In the case of dry resists, solutions of the mixture are applied to transparent temporary supports and dried. The photosensitive layers—thickness between about 10 and 100 μm—are then laminated onto the desired substrate together with the temporary support.

Due to the broad spectral sensitivity of the mixture according to the invention, all light sources known to those skilled in the art can be used, for example, tubular lamps, xenon impulse lamps, metal halide-doped mercury vapor high-pressure lamps and carbon arc lamps. In addition, exposure in conventional projectors and enlargers under the light of metal filament lamps, and contact exposure using conventional incandescent bulbs are possible in the case of the photosensitive mixtures according to the invention. Exposure can also take place using coherent light from a laser. Suitable for the purpose of the present invention are lasers of suitable power, for example argon ion, krypton ion, dye, helium/cadmium and helium/neon lasers, which emit, in particular, between 250 and 650 nm. The laser beam can be controlled by means of a prespecified programmed line movement.

The further processing of the materials is carried out in a known fashion. For better crosslinking of the layers, post-heating after exposure can take place. For development, they are treated with a suitable developer solution, for example, with organic solvents, but preferably with a slightly alkaline, aqueous solution, the unexposed parts of the layers being removed and the exposed areas of the copying layer remaining on the support. Illustrative embodiments of the invention are given below, with, firstly, a number of new polymerizable compounds being listed in Table I.

These compounds are produced by one of the two processes given below. In the Examples which follow, the compounds are employed as polymerizable compounds in recording materials according to the invention. In the examples, parts by weight (PW) and parts by volume (PV) are in the ratio g to cm$^3$. Percentage and weight ratios are taken to mean weight units, unless otherwise stated.

1. General Procedure for the Preparation of Compounds of General Formula I Where b=0 (Compounds 1 to 8 and 11 in Table I)

The hydroxyalkyl-group-containing amino compound and the isocyanatoalkyl (meth)acrylate are refluxed in the desired molar ratio in ten times the amount of the suitable solvent (toluene, butanone or pyridine) with 0.01% by weight of dibutyltin dilaurate and 0.01% by weight of 2,6-di-tert.butyl-p-cresol until the isocyanate band (2275-2250 cm$^{-1}$) can no longer be detected in the IR spectrum (generally after 5 to 8 hours). The solvent is subsequently removed by distillation in vacuo at 50° C. The unsaturated compound remains in virtually quantitative yield as a viscous residue or in the form of crystals.

2. General Procedure for the Preparation of Compounds of the General Formula I Where b=1 (Compounds 9 and 12 in Table I)

Hydroxyalkyl (meth)acrylate and diisocyanate are refluxed for 8 hours in the molar ratio 1:1 in ten times the amount of solvent (toluene, butanone or pyridine) with 0.01% by weight of dibutyltin dilaurate and 0.01% by weight of benzoquinone, and the desired number of moles of hydroxyalkylamine is subsequently added and the mixture refluxed further until the isocyanate band has disappeared in the IR spectrum (generally after 5 to 8 hours). The solvent is subsequently removed by distillation in vacuo at 50° C. The unsaturated compound remains in virtually quantitative yield as a viscous residue.

TABLE I

Compounds of the general formula I with R = CH$_3$; X$^3$ = CH$_2$CH$_2$

| Compound No. | Q | X$^1$ | X$^2$ | Z | a | b | n |
|---|---|---|---|---|---|---|---|
| 1 | (cyclohexyl-N—/Z) | — | — | C$_2$H$_4$OZ$_1$ | 0 | 0 | 1 |

TABLE I-continued

Compounds of the general formula I with R = $CH_3$; $X^3$ = $CH_2CH_2$

| Compound No. | Q | $X^1$ | $X^2$ | Z | a | b | n |
|---|---|---|---|---|---|---|---|
| 2 | $-\underset{\mid}{N}-$ | $\begin{cases} - \\ CH_2 \\ CH_2 \end{cases}$ | — — — | — — — | 0 1 1 | 0 0 0 | 3 |
| 3 | (piperidine ring with N— and substituent Z) | — | — | $CH_2OZ^1$ | 0 | 0 | 1 |
| 4 | $-N\underset{\smile}{\frown}N-$ | $\begin{cases} - \\ CH_2 \end{cases}$ | — — | — — | 0 1 | 0 0 | 2 |
| 5 | $-N\underset{\smile}{\frown}N-$ | $\begin{cases} - \\ CH_2-CHO-Z^1 \end{cases}$ | — — | — — | 0 1 | 0 0 | 2 |
| 6 | (piperidine ring with N— and substituent Z at 3-position) | — | — | $CH_2OZ^1$ | 0 | 0 | 1 |
| 7 | $-N\underset{\smile}{\frown}N-$ | $\begin{cases} - \\ CH_2CH_2 \end{cases}$ | — — | — — | 0 1 | 0 0 | 2 |
| 8 | $-\underset{\mid}{N}-$ | $\begin{cases} - \\ - \\ CH_2 \end{cases}$ | — — — | — — — | 0 0 1 | 0 0 0 | 3 |
| 9 | $-\underset{\mid}{N}-$ | $\begin{cases} CH_2 \\ CH_2 \\ - \end{cases}$ | $(CH_2)_6$ $(CH_2)_6$ $(CH_2)_6$ | — — — | 1 1 0 | 1 1 1 | 3 |
| 10 (C) | $CH_3-\underset{\mid}{N}-$ | $\begin{cases} CH_2 \\ CH_2 \end{cases}$ | — — | — — | 1 1 | 0 0 | 2 |
| 11 (C) | $-\underset{\mid}{N}-$ | $\begin{cases} CH_2 \\ CH_2 \\ CH_2 \end{cases}$ | — — — | — — — | 1 1 1 | 0 0 0 | 3 |
| 12 (C) | $-\underset{\mid}{N}-$ | $\begin{cases} CH_2 \\ CH_2 \\ CH_2 \end{cases}$ | $(CH_2)_6$ $(CH_2)_6$ $(CH_2)_6$ | — — — | 1 1 1 | 1 1 1 | 3 |

C = Comparative Test
$Z^1$ = $CONH-(CH_2)_2-OOC-\underset{\underset{CH_3}{\mid}}{C}=CH_2$

EXAMPLE 1

Electrochemically-grained and anodically-oxidized aluminum that has an oxide layer weight of 3 g/m² and that has been pretreated with an aqueous solution of polyvinylphosphonic acid is used as the layer support material for printing plates. The supports are coated with solutions of the following composition:

2.84 PW of a 22.3 % strength solution in methyl ethyl ketone, of a terpolymer made from styrene, n-hexyl methacrylate and methacrylic acid (10:60:30) having an acid number of 190, 1.49 PW of a monomer in accordance with Table II,
0.04 PW of alcohol-soluble Eosine (C.I. 45 386),
0.03 PW of 2,4-bis-trichloromethyl-6-(4-styryl-phenyl)-s-triazine and
0.049 PW of 9-phenylacridine in 22 PW of propylene glycol monomethyl ether.

Application is by spin-coating such that a dry weight of 2.0 to 2.5 g/m² is obtained. The plates are subsequently dried for 2 minutes at 100° C. in a convection oven. The plates are then coated with a 7% strength aqueous solution of polyvinyl alcohol (12% of residual acetyl groups, K value 4). After drying, a protective layer having a weight of 2 to 2.5 g/m² is obtained. The printing plates obtained are exposed using a 5 kW metal halide lamp at a distance of 110 cm under a 13-step exposure wedge having density increments of 0.15 and on which, where specified, a silver film of uniform optical density (density 1.57) and uniform absorption over the effective spectral range is additionally mounted as a neutral density filter. In order to test the sensitivity of the printing plates in visible light, a 3 mm thick sharp cut-off filter from Messrs. Schott having the cut-off transmissions given in th table is mounted in each case on the exposure wedge. After exposure, the plates are heated to 100° C. for one minute. They are subsequently developed in a developer of the following composition:

120 PW of sodium metasilicate ×9 H₂O,
2.13 PW of strontium chloride,
1.2 PW of non-ionogenic wetting agent (coconut fat alcohol polyoxyethylene ether containing about 8 oxyethylene units) and
0.12 PW of antifoam agent, in
4000 PW of demineralized water.

The plates are inked with a greasy printing ink. The following numbers of fully-crosslinked wedge steps are obtained:

TABLE II

| Compound No. | Neutral Exposure (seconds) | Filter | Sharp Cut-Off Density Filter (nm) | Wedge Steps |
|---|---|---|---|---|
| 1 | 10 | yes | — | 10 |
|  | 10 | no | 455 | 9 |
| 2 | 10 | yes | — | 9 |
|  | 10 | no | 455 | 7 |
| 3 | 10 | yes | — | 9 |
|  | 10 | no | 455 | 7 |
| 4 | 10 | yes | — | 8 |
|  | 10 | no | 455 | 6 |
| 5 | 10 | yes | — | 12 |
|  | 10 | no | 455 | 8 |
| 6 | 10 | yes | — | 8 |
|  | 10 | no | 455 | 6 |
| 7 | 10 | yes | — | 7 |
|  | 10 | no | 455 | 5 |
| 8 | 10 | yes | — | 8 |
|  | 10 | no | 455 | 4 |
| 9 | 20 | yes | — | 6 |
|  | 20 | no | 455 | 4 |
| 10(C) | 5 | yes | — | 8 |
|  | 5 | no | 455 | 6 |
| 11(C) | 10 | yes | — | 11 |
|  | 10 | no | 455 | 9 |
| 12(C) | 20 | yes | — | 7 |
|  | 20 | no | 455 | 5 |

EXAMPLE 2

The shelf lives of the printing plates produced according to Example 1 are tested. For this purpose, the printing plates are stored in a convection oven at 80° C. over several hours. After the storage periods specified in Table III below the plates are processed as described in Example 1. The following numbers of fully-crosslinked wedge steps are obtained using the sharp cut-off filter 455 nm:

TABLE III

| Compound No. | Exposure (seconds) | Sharp Cut-Off Filter (nm) | Wedge steps: Storing Time (hours) | | | | |
|---|---|---|---|---|---|---|---|
| | | | ½ | 1 | 2 | 3 | 4 |
| 1 | 10 | 455 | 8 | 8 | 8 | 8 | 7 |
| 2 | 10 | 455 | 7 | 7 | 7 | 6 | 6 |
| 3 | 10 | 455 | 7 | 7 | 7 | 6 | 6 |
| 5 | 10 | 455 | 8 | 7 | 7 | 6 | 5 |
| 8 | 10 | 455 | 4 | 4 | 4 | 4 | 4 |
| 9 | 20 | 455 | 4 | 4 | 4 | 4 | 3 |
| 10(C) | 5 | 455 | 4 | 2* | — | — | — |
| 11(C) | 10 | 455 | 8 | 7 | 6 | 2* | — |
| 12(C) | 20 | 455 | 4 | 3 | 3 | 2 | — |

— no crosslinking
*plate not free from scum

What is claimed is:
1. A photopolymerizable mixture comprising, in admixture:
a) a polymeric binder in an amount sufficient to form a uniform film,
b) an acrylate or alkacrylate of a polyhydric alcohol,
c) a photoreducible dye,
d) a trihalomethyl compound that can be cleaved by irradiation, and
e) an acridine, phenazine or quinoxaline compound that acts as photoinitiator,
wherein the acrylate or alkacrylate is a compound of the formula I

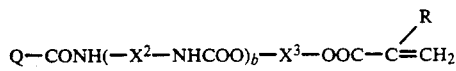

in which
Q denotes

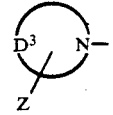

R denotes a hydrogen atom, a methyl group or an ethyl group,
X² denotes a saturated hydrocarbon group having 2 to 12 carbon atoms,
X³ denotes a saturated hydrocarbon group which may be interrupted by 1 to 5 ether oxygen atoms,
D³ denotes a saturated hydrocarbon group having 4 to 8 carbon atoms, which together with the nitrogen atom forms a 5- or 6-membered ring,
Z denotes a hydrogen atom or a group of the formula

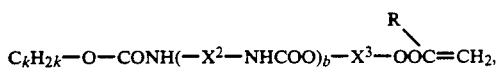

b denotes zero or 1, and
k denotes an integer from 1 to 12, it being possible for all radicals of the same definition to be identical to or different from one another, wherein components b, c, d and e are present in amounts sufficient to cause polymerization of component b in response to exposure to actinic radiation.

2. A mixture as claimed in claim 1, comprising at least two acrylate or alkacrylate groups.

3. A mixture as claimed in claim comprising at least one urethane group.

4. A mixture as claimed in claim 1, wherein R denotes $CH_3$.

5. A mixture as claimed in claim 1, wherein a denotes zero or 1.

6. A mixture as claimed in claim 1, wherein m denotes an integer from 2 to 10.

7. A mixture as claimed in claim 1, wherein the photoreducible dye comprises a xanthene, benzoxanthene, benzothioxanthene, thiazine, pyronine, porphyrine or acridine dye.

8. A mixture as claimed in claim 1, wherein the trihalomethyl compound that can be cleaved by irradiation comprises an s-triazine substituted by at least one trihalomethyl group and one further group or comprises an aryl trihalomethyl sulfone.

9. A mixture as claimed in claim 1, wherein the binder is insoluble in water and soluble in aqueous-alkaline solutions.

10. A mixture as claimed in claim 1, comprising about 10 to 80% by weight of acrylate or alkacrylate, about 20 to 90% by weight of polymeric binder and about 0.05 to 20% by weight of radiation-activatable polymerization initiators (c), (d) and (e), in each case relative to the nonvolatile components of the mixture.

11. A mixture as claimed in claim 1, additionally comprising a dibenzal- acetone or coumarine compound.

12. A photopolymerizable mixture according to claim 1 consisting essentially of components a, b, c, d and e.

13. A photopolymerizable mixture according to claim 1, wherein
R is a hydrogen atom or a methyl group,
$X^2$ is a straight-chain or branched aliphatic or cycloaliphatic radical, and
$X^3$ has 2 to 15 carbon atoms.

14. A photopolymerizable mixture according to claim 13, wherein
R is a methyl group,
$X^2$ is a straight-chain or branched aliphatic or cycloaliphatic radical having 4 to 10 carbon atoms.

15. A photopolymerizable recording material, comprising:
a layer support, and
a photopolymerizable layer comprising a mixture as claimed in claim 1.

16. A mixture as claimed in claim 1, wherein b=0.

17. A mixture as claimed in claim 1, wherein $Z=CH_2OZ^1$ in which $Z^1$ is $CONH-(CH_2)_2-OOC-C(CH_3)=CH_2$.

18. A mixture as claimed in claim 16, wherein $Z=CH_2OZ^1$ in which $Z^1$ is $CONH-(CH_2)_2-OOC-C(CH_3)=CH_2$.

* * * * *

UNITED STATES PATENT AND TRADEMARK OFFICE
CERTIFICATE OF CORRECTION

PATENT NO. : 5,066,564
DATED : November 19, 1991
INVENTOR(S) : ZERTANI ET AL

It is certified that error appears in the above-indentified patent and that said Letters Patent is hereby corrected as shown below:

Column 15, line 6, claim 3, after "claim" insert --1--.

Signed and Sealed this

Twelfth Day of July, 1994

*Attest:*

BRUCE LEHMAN

*Attesting Officer*     *Commissioner of Patents and Trademarks*